United States Patent [19]

Besserer et al.

[11] Patent Number: 5,513,759

[45] Date of Patent: May 7, 1996

[54] RACK FRAME

[75] Inventors: Horst Besserer, Herborn; Klaus-Dieter Bovermann, Breidenbach-Niederdieten; Marc Hartel, Reiskirchen, all of Germany

[73] Assignee: Rittal-Werk Rudolf Loh GmbH & Co. KG, Germany

[21] Appl. No.: 313,850

[22] Filed: Sep. 28, 1994

[30] Foreign Application Priority Data

Sep. 28, 1993 [DE] Germany ............................ 43 33 027.4

[51] Int. Cl.⁶ .................................................. A47B 47/00
[52] U.S. Cl. ...................... 211/189; 312/265.2; 312/265.6
[58] Field of Search ............................... 211/189, 26, 191; 312/140, 265.1, 265.2, 265.4, 265.5, 265.3, 140, 257.1, 263

[56] References Cited

U.S. PATENT DOCUMENTS

| | | | |
|---|---|---|---|
| 3,976,344 | 8/1976 | Frydman | 312/265.5 |
| 4,566,742 | 1/1986 | Schmied | 312/257.1 |
| 4,643,319 | 2/1987 | Debus et al. | 211/189 |
| 4,988,008 | 1/1991 | Blum et al. | 211/189 |
| 5,202,818 | 4/1993 | Betsch et al. | 361/429 |
| 5,267,658 | 12/1993 | Schwenk et al. | 211/26 |

FOREIGN PATENT DOCUMENTS

| | | |
|---|---|---|
| 4109695 | 4/1992 | Germany. |
| 2052878 | 1/1981 | United Kingdom. |

*Primary Examiner*—Leslie A. Braun
*Assistant Examiner*—Anita M. King
*Attorney, Agent, or Firm*—Speckman, Pauley & Fejer

[57] ABSTRACT

A rack frame having two front and two rear supports, which can be closed off by means of wall elements, except for the front, and into which structural units can be built. Holders, on which the structural units can be fastened, are attachable to both front supports. Wall elements can be simply attached at arbitrary heights. Structural units with different installation depths can be attached so that they terminate flush with each other either in the front or the rear. This is accomplished by perpendicular longitudinal slots for receiving beveled edges of the wall elements that are formed in the exteriors of the rear supports. The rear supports have fastening strips, which extend spaced apart and parallel to the wall elements. Adjustable U-shaped fastening elements can be attached to the fastening strips, and are used to fix the wall elements. The front supports have longitudinal slots for receiving the beveled edges of the lateral wall elements on the lateral outer surfaces, and the front supports have fastening strips extending at a distance and parallel with the wall elements. Adjustable U-shaped fastening elements, to which these wall elements can be attached, are positioned on the fastening strips. The front supports have longitudinal receivers for the holders on their inner surfaces. The longitudinal receivers are parallel with the outer surfaces to which the holders can be attached, and thus the holders are adjustable in depth.

23 Claims, 4 Drawing Sheets

RACK FRAME

BACKGROUND OF THE INVENTION

1. Field of the Invention

This invention relates to a rack frame with two front and two rear supports. The rear supports can be closed off by wall elements, which can support structural units which can be fastened on holders that are attachable to both front supports.

2. Description of Prior Art

Conventional supports of rack frames of this type are provided with fastening receivers. The wall elements can be connected with the fastening receivers by fastening elbows or, depending on the arrangement of the fastening receivers, can be screwed directly to the supports. The partial closing of a lateral wall, however, with wall elements that are partial panels, is not possible with a rack frame of this type. To avoid this problem, another type of rack frame has supports with rows of fastening receivers attached in the longitudinal direction. In this type of rack frame the fastening receivers are evenly distributed. It is possible to fasten partial panels in predetermined positions on such a rack frame.

SUMMARY OF THE INVENTION

It is one object of this invention to provide a rack frame wherein it is possible to attach wall elements quickly and in a simple manner at arbitrary heights on its vertical supports, and wherein it is possible to fasten structural units of different installation depths in a simple manner in such a way that they are aligned flush either on the back or the front of the rack frame.

This object and others are achieved in a rack frame having perpendicular longitudinal slots cut into the exteriors of the rear supports for receiving beveled edges of wall elements. The rear supports have fastening strips which extend spaced apart and parallel with the wall elements. Adjustable U-shaped fastening elements are provided, on which the wall elements can be fastened. The front supports have longitudinal slots for receiving the beveled edges of the lateral wall elements on the lateral outer surfaces, and also have fastening strips extending at a distance and parallel with the wall elements for the adjustable U-shaped fastening elements. The wall elements can be attached to the adjustable U-shaped fastening elements. The inner surfaces of the front supports have longitudinal receivers for the holders which are parallel with the outer surfaces to which the holders can be attached, and thus the holders are adjustable in depth.

The fastening elements can be attached to the fastening strips and displaced along the fastening strips until the fastening elements attain their desired position. The fastening elements can be fixed in this position and connected to a wall element. It is possible to partially close off a lateral wall, for example, with several partial wall elements. This can be important when several rack frames are lined up next to each other and connecting lines extend through the lateral walls from one rack frame to the next rack frame. Detachable partial wall elements furthermore allow simple and rapid access to defined sectors of the rack frame. This is particularly advantageous for maintenance purposes.

A wall element fixed by the fastening elements can be displaced along the fastening strips on the supports into a desired position. The fastening elements can be locked in this position, so that the wall elements are also fixed in place. The wall elements can be simply inserted with their edges into the longitudinal slots and in this way prepositioned, so that they can be fastened without time-consuming efforts.

The individual structural units can be displaced in the direction of the depths of the rack frame by the adjustable holders in such a way that they form a common plane at the front or the rear. In this case the holders can be adjusted either continuously or in partial steps. Structural units of the same installation depth can be attached in one holder. If it is intended, for example, to install several subassembly supports which are formed in accordance with the English linear system together with subassembly supports which are in accordance with the metric system in one rack frame, two holders are fastened above each other on the front supports. The different subassembly supports are then fastened on the respective holders and can be positioned in the rack frame so that the rear connection walls of the subassembly supports in accordance with the metric system as well as the subassembly supports built in accordance with the English system form a common connecting plane.

The capability of adjusting the holders in the direction of the depth of the rack frame and fixing them in place also offers advantages in the optimal utilization of the space in the front area of the rack frame. For example, large operating elements with great extensions in depth can also be housed.

In accordance with one preferred embodiment of this invention, a vertical bearing strip is positioned on the support. The vertical bearing strip is offset with respect to the exterior of the support in the direction toward the interior of the rack frame. The fastening strip is offset in the direction toward the interior of the rack frame with respect to the bearing strip and the inside of the wall element is supported on the bearing strip.

The fastening elements are positioned behind the wall element, facing the interior of the rack frame. In this way the wall elements can be easily installed from the exterior of the rack frame. Furthermore, the fastening element is covered by the wall element, so that it is not visually unappealing.

According to one embodiment of this invention, if the bearing strip of the support is set back with respect to the exterior of the support by the thickness of the wall element, the wall element is aligned flush with the exterior of the support.

In a preferred embodiment of this invention, the bearing strip adjoins the longitudinal slot of the support. In this way no slot oriented toward the exterior of the rack frame is created on the support adjoining the edge of the wall element.

According to one embodiment of this invention, the rack frame can be sealed against moisture, and sealing elements can be inserted into the longitudinal slot of the support. The front of the edge of the wall element can then be pressed against the sealing element in the bottom of the longitudinal slot. A rubber packing cord can be used as the sealing element. However, it is also possible for a sealing element to be placed on the bearing strip or on the inside of the wall element facing the bearing strip.

According to another preferred embodiment of this invention, the fastening strips are undercut and are facing each other on the front support and the rear support. Two undercuts are formed in this way, on which an appropriately designed fastening element is positioned and can be continuously displaced in the long direction of the longitudinal slot.

According to another embodiment of this invention, the fastening element has two legs which are spaced apart, parallel to each other, and extend beyond the fastening strip on both sides. The leg facing the wall element has a screw receiver and the leg facing away from the wall element has a threaded receiver aligned with the screw receiver. The wall element also has a screw receiver aligned with the screw receiver of the leg, and a fastening screw is inserted through the two screw receivers and screwed into the threaded receiver of the leg. The fastening element is a simple component and can be produced cost-effectively. Depending on the material selected, the two legs can be resiliently braced on the fastening strip and can spring back into their initial position after the fastening screw has been released. It is then possible to displace the fastening element again on the fastening strip.

For simple attachment of the fastening element to the fastening strip, the legs of the fastening element extend parallel with the wall element and are oriented toward the front on the front supports and toward the rear on the rear supports. It is thus possible to easily insert the fastening screw holding the wall element from the exterior of the wall element.

According to another preferred embodiment of this invention, the receivers facing the inner sides of the front supports are shoulders which make a transition toward the front into a stop. In this way the front support can be made as a simple part. The stop fixes the holder in its initial position from which it can be displaced by the desired amount.

In another preferred embodiment, the front support has a longitudinally directed holding strip on which a U-shaped fastening element can be displaced in the longitudinal direction. An elongated hole extending in the direction of the depth of the rack frame is cut into the leg of the holder into which a fastening screw can be inserted and screwed together with a threaded receiver of the fastening element. The U-shaped fastening element can be simply connected with the holding strip, for example, by clips. The fastening elements can be continuously displaced on the holding strip in the direction of the height of the rack frame. Thus, the holders can also be continuously adjusted, so that the installed height of the built-ins can be freely set.

According to one embodiment of this invention, the holding strip is offset toward the interior, parallel with respect to the outside of the front support, and adjoins the shoulder of the front support. It is thus possible to fasten the holder spaced apart from the outside of the rack frame. It is also possible to attach lateral walls to the supports, by which the rack frame can be closed off. The displacement capacity of the holders is unaffected by this.

In a preferred embodiment of this invention, the fastening element has two legs extending beyond the holding strip on both sides, of which the leg facing away from the angle element has the threaded receiver and the leg facing the angle element has a screw receiver aligned therewith.

A simple attachment of the fastening element to the holding strip and the readily accessible fastening of the holder is possible when the legs of the fastening element are oriented toward the front of the rack frame.

According to one embodiment of this invention, the leg of the angle element is screwed to a downward extending brace. The downward extending brace is fastened to the front support by a retaining projection, and thus allows the installation of, for example, subassembly supports of little installed depth. In this embodiment the downward extending braces can extend as guides over the entire depth of the rack frame. They are then preferably also fastened on the rear vertical supports. In this way it is also possible to securely fix and guide very heavy built-ins.

It is also possible that the retaining projection of the downward extending brace can be fastened to the holding strip of the front support by a fastening element. In this way the downward extending brace can also be continuously adjusted in height on the rack frame.

The invention will be explained in detail below by preferred embodiments shown in the drawings.

BRIEF DESCRIPTION OF THE DRAWINGS

The above-mentioned and other features and objects of this invention will be better understood from the following detailed description taken in conjunction with the drawings, wherein.

DESCRIPTION OF PREFERRED EMBODIMENTS

Figure 1:
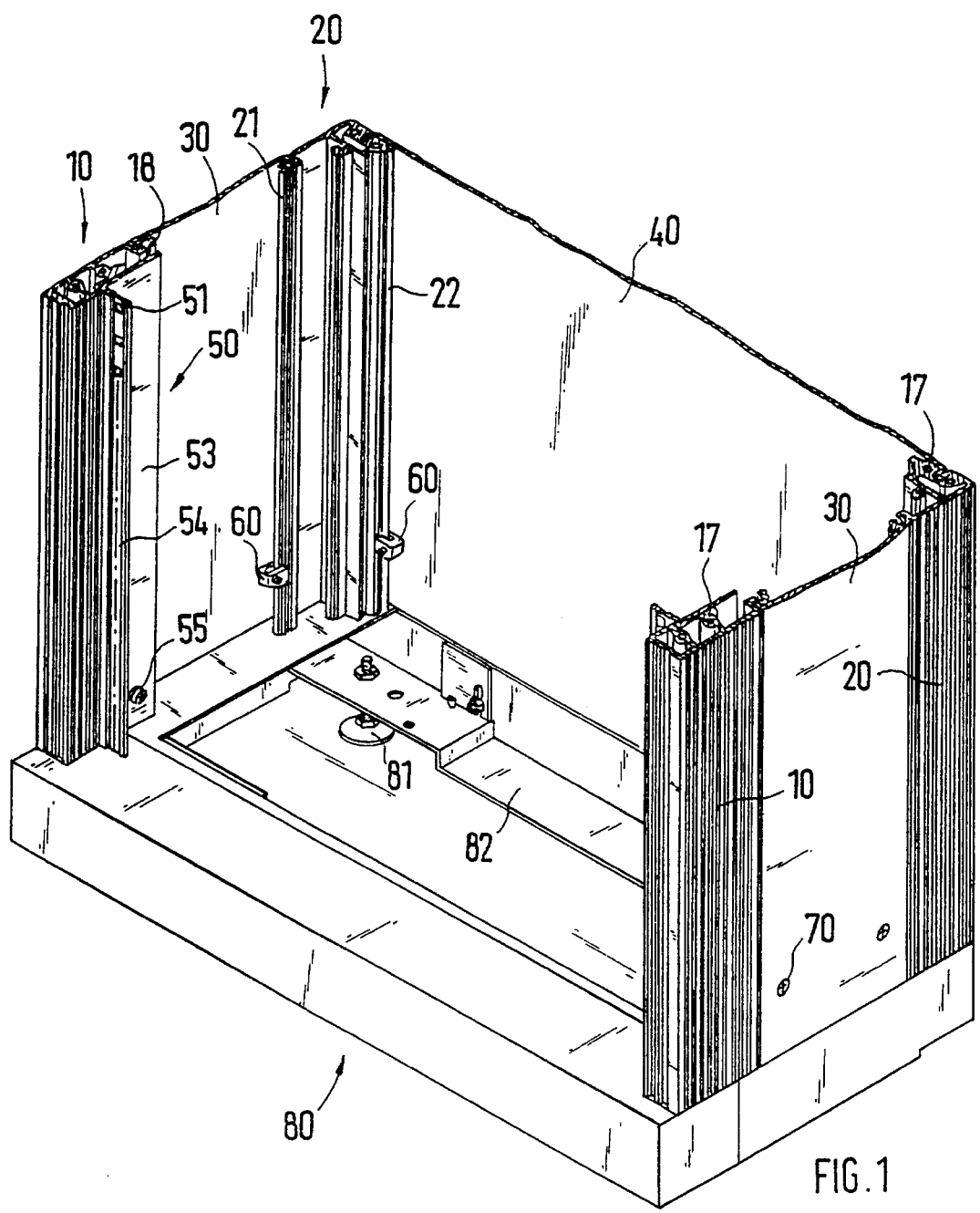
FIG. 1 is a perspective view of a portion of a rack frame of this invention with a base.

A portion of a rack frame having four vertical supports 10, 20 and a base 80 is shown in FIG. 1. A transverse brace 82 is fastened on the base 80. The transverse brace 82 extends horizontally for the width of the rack frame. Bores have been formed near end portions of the transverse brace 82, into which bores adjusting feet 81 are inserted by threaded bolts cooperating with the adjusting feet 81. The height of the rack frame can be adjusted by the adjusting feet 81.

The base 80 has fastening receivers, into which fastening screws can be inserted from the underside of the base 80, and screwed into longitudinally oriented screw channels 17 of the supports 10, 20.

Holders 50, comprising angle strips, are attached to the two front supports 10. The holder 50 has a leg 53 on which a holding projection 54 is formed at right angles. The holding projection 54 has a row of fastening receivers 51. The holders 50 are attached to the insides of the two front supports 10 so that the holding projections 54 face each other. Fastening the holders 50 to the front supports 10 is achieved with fastening screws 55, which are introduced into elongated holes formed on the leg 53 and screwed into fastening elements 60, which can be connected with the front supports 10. The fastening element 60 is fastened on a longitudinally oriented clamping strip 18 of the front support 10. Built-ins, for example subassembly supports, can be fastened on the holding projections 54 of the holders 50 by means of the fastening receivers 51.

The lateral walls and the rear wall of the rack frame are closed by wall elements 30, 40.

Figure 2:
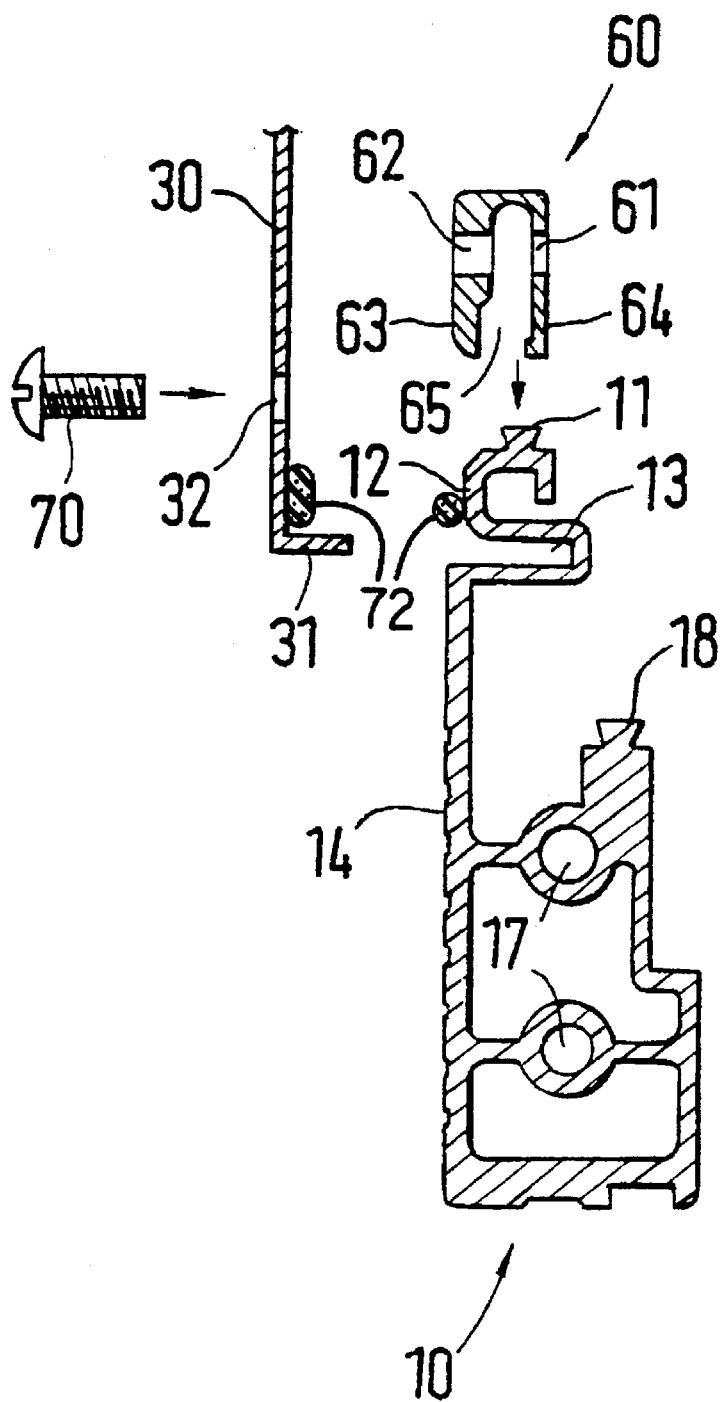
FIG. 2 is an exploded top view of a support, a wall element and a fastening element according to one preferred embodiment of this invention.

FIG. 2 shows the front support of FIG. 1 in an exploded view, and a wall element 30 and a fastening element 60. The front support 10 has a longitudinally oriented fastening strip 11, to which fastening elements 60 are displaceably attached. The fastening strip 11 is, in one preferred embodiment, V-shaped in cross section and tapered in the direction of the support 10. The fastening strip 11 is offset in the direction of the interior of the rack frame in relation to the wall element 30.

The fastening element 60 has two legs 63, 64, which are positioned apart parallel to each other, and formed between the two legs 63, 64 is a receptacle 65, so that the legs 63, 64 project beyond the fastening strip 11 on both sides. In accordance with one embodiment of this invention, the legs 63, 64 are adapted to the V-shaped fastening strip 11, so that they project beyond it in a positive manner. The two legs 63, 64 are oriented parallel to the wall element 30. The leg 63 facing the wall element 30 is provided with a screw receiver 62, which is offset with respect to the fastening strip 11. A threaded receiver 61 is formed, aligned with the screw receiver 62, in the leg 64 facing away from the wall element 30. The wall element 30 has a screw receiver 32 which can be aligned with the screw receiver 62 of the leg 63.

A fastening screw 70 can be inserted from the exterior of the rack frame into the screw receivers 32 and 62, respectively, and can engage the threaded screw receiver 61 of the leg 64. Thus, the two legs 63, 64 grasp the fastening strip 11 in the receiver 65 so that the fastening element 60 as well as the wall element 30 are fixed on the front support 10. As shown in FIG. 1, this fastening mechanism is similarly employed for the two rear supports 20.

Figure 5:
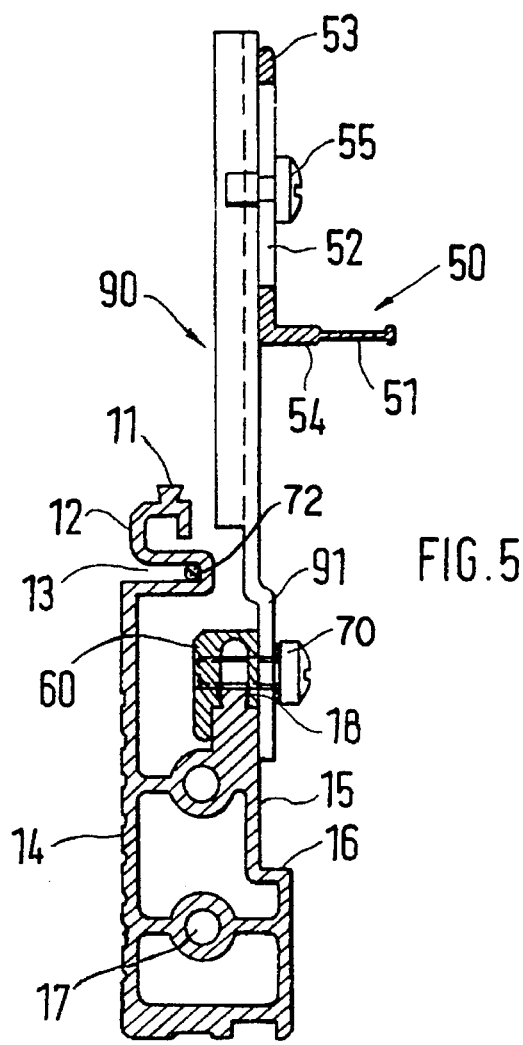
FIG. 5 is a cross-sectional top view of the front support of FIG. 3 with a downward extending support.

According to one preferred embodiment of this invention, the wall elements 30 have vertical edges 31 which are inserted into longitudinal slots 13 of the supports 10, 20. A bearing strip 12 adjoins the longitudinal slots 13 and is offset toward the interior of the rack frame with respect to the profile exterior 14 by the distance corresponding to the thickness of the wall element 30. Thus, the beveled edges 31 of the wall element 30 can be inserted into the longitudinal slots 13. The insertion movement is limited by the bearing strip 12 which abuts against the inside of the wall element 30. As shown in FIG. 5, a sealing element 72, such as a rubber packing cord, can be positioned in longitudinal slot 13 to seal the rack frame from moisture. According to another preferred embodiment of this invention, the sealing element 72 can be positioned on the vertical bearing strip 12, and/or on the inside of the wall elements 30, as shown in FIG. 2.

Figure 3:
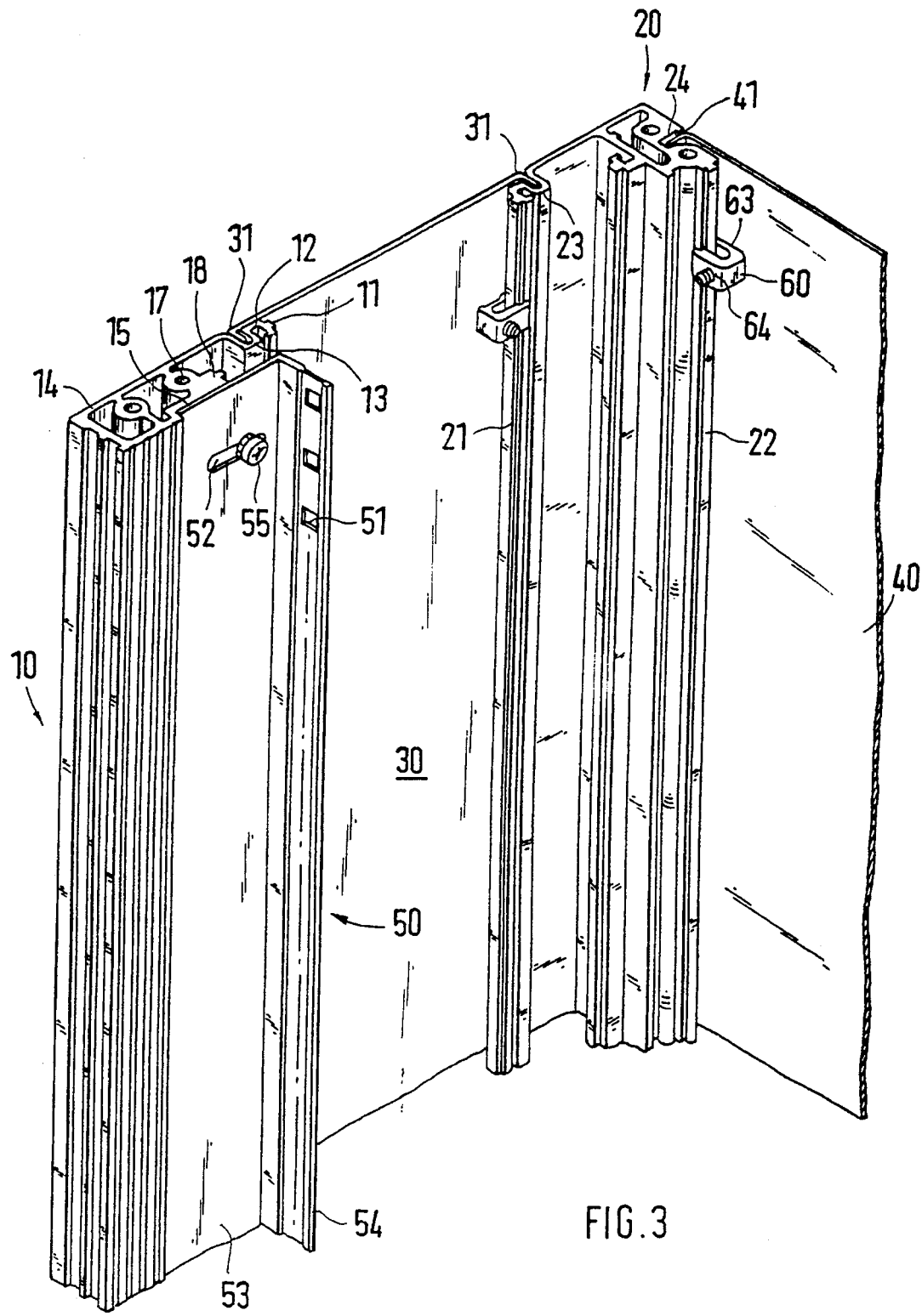
FIG. 3 is a perspective view of a section of a front and a rear vertical support of a rack frame, according to one preferred embodiment of this invention, on which a lateral wall and a rear wall have been fastened.

A portion of a rack frame with its front and rear vertical supports 10 and 20, according to one preferred embodiment of this invention, is illustrated in FIG. 3. The rack frame can be closed off by lateral wall elements 30 and a rear wall element 40. Rear support 20 includes longitudinal slots 23 & 24. Longitudinal slot 24 can accept beveled edge 41 or rear wall element 40. Rear support 20 also includes fastening strips 21 & 22 on which fastening elements 60 can be positioned.

A holder 50 is placed on the front support 10. The holder 50 is formed as an angle element comprising a leg 53, on which a fastening projection 54 has been formed at right angles. The fastening projection 54 extends parallel to the front of the rack frame and has a plurality of evenly spaced fastening receivers 51 formed thereon. The fastening projections 54 of the holders 50 fastened on the front supports 10 face each other.

Figure 4:
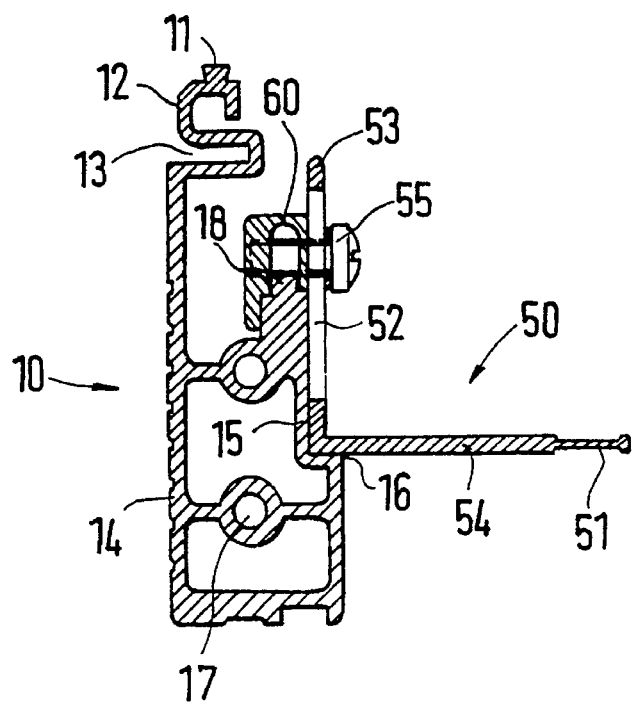
FIG. 4 is a cross-sectional top view of the front support of FIG. 3 with a holder.

Built-ins extending into the interior of the rack frame can be fastened on the fastening receivers 51. Elongated holes 52, extending in the direction of the cabinet depth, are formed on the holder 50. Fastening screws 55 are inserted into the elongated holes 52 and screwed together with fastening elements 60, as shown more clearly in FIG. 4, where the front support 10, in one embodiment of this invention, is shown in a top view. A leg 53 of the holder 50 is inserted into a longitudinal receiver 15 of the front support 10. The longitudinal receivers 15 are shoulders on the facing insides of the front supports 10, the longitudinal receivers 15 making a transition into a stop 16 toward the front of the front support 10.

At the rear of the front support 10, the shoulder makes a transition into a longitudinally extending holding strip 18. The fastening element 60 is fixed on the holding strip 18 by clips. The fastening element 60 has two parallel legs 63, 64, of which the leg 64, facing away from the holder 50, has a threaded receiver 61. The leg 63 facing the holder 50 has a screw receiver 62 aligned with the threaded receiver 61. The fastening screw 55 is inserted into the elongated hole 52 of the holder 50 and into the screw receiver 62 of the leg 63 and engages the threaded receiver 61 of the leg 64. Thus, the two legs 63, 64 of the fastening element 60 are braced on the holding strip 18 and the holder 50 is fixed on the front support 10. If the fastening screw 55 is loosened, the fastening projection 54 can be displaced in the direction of the depth of the rack frame due to the elongated hole 52, and the holder 50 can also be continuously displaced on the front support 10 in the direction of the height of the rack frame.

Another embodiment of a holder 50 of this invention is shown in FIG. 5. In this embodiment the holder 50 comprises a downward extending brace 90 and an angle element. The downward extending brace 90 has a retaining projection 91 on a side facing the front support 10, into which a screw receiver has been formed. The downward extending brace 90 can be connected to the front support 10 by the fastening elements 60 and the fastening screw 70. Thus, the downward extending brace 90 can be continuously displaced in the direction of the height of the rack frame.

The angle element is fastened with a leg 53 on the downward extending brace 90 and can be continuously displaced thereon due to an elongated hole 52 and a fastening screw 55.

Threaded receivers can be cut into the downward extending brace 90, evenly spaced and offset from each other, into which the fastening screw 55 can be screwed. Thus, a displacement possibility over the entire length of the downward extending brace 90 has been provided by the angle element.

We claim:

1. In a rack frame having two front and two rear supports, a plurality of wall elements into which structural units can be built, a plurality of holders on which the structural units can be fastened attachable to both front supports, the improvement comprising: each of the rear supports (20) forming at least two perpendicular longitudinal slots (23, 24) receiving a beveled edge (31, 41) of one of the wall elements (30, 40), each of the rear supports (20) comprising a plurality of first fastening strips (21, 22) which extend parallel with one of the wall elements (30, 49), the first fastening strips (21, 22) having a plurality of adjustable U-shaped fastening elements (60) secured thereto on which one of the wall elements (30, 40) is attached, the front supports (10) having at least one longitudinal slot (13) formed thereon receiving a beveled edge (31) of one of the lateral wall elements (30), the front supports (10) comprising a second fastening strip (11) extending at a distance and parallel to one of the wall elements (30), the second fastening strip (11) having adjustable U-shaped fastening elements (60) secured thereto to which one of the wall elements (30) is attached, and the front supports (10) having a longitudinal receiver (15) formed on an inner surface of the front supports (10) for receiving a holder (50), the longitudinal receiver (15) being parallel to an outer surface of the holder (50), and the holder (50) being adjustable in depth.

2. In a rack frame in accordance with claim 1, wherein a vertical bearing strip (12) is positioned on at least one of the supports (10, 20), the vertical bearing strip (12) is offset with respect to an exterior of one of the supports (10, 20) in a first direction of an interior of the rack frame, the first fastening strips (21, 22) and the second fastening strip (11) are offset in a second direction of an interior of the rack frame with respect to the vertical bearing strip (12), and an inside of at least one of the wall elements (30, 40) is supported by the vertical bearing strip (12).

3. In a rack frame in accordance with claim 2, wherein the vertical bearing strip (12) is recessed with respect to the exterior of one of the supports (10, 20) by a thickness of one of the plurality of wall elements (30, 40).

4. In a rack frame in accordance with claim 3, wherein the vertical bearing strip (12) is adjacent to one of the at least two perpendicular longitudinal slots (23, 24) and the at least one longitudinal slot (13).

5. In a rack frame in accordance with claim 4, wherein a sealing element is positioned in one of the at least two perpendicular longitudinal slots (23, 24) and the at least one longitudinal slot (13).

6. In a rack frame in accordance with claim 4, wherein a sealing element is positioned on one of the vertical bearing strips (12) and the inside of one of the wall elements (30, 40) facing the vertical bearing strip (12).

7. In a rack frame in accordance with claim 6, wherein the second fastening strip (11) formed on one of the front supports (10) faces one of the plurality of first fastening strips (21, 22) formed on one of the rear supports (20).

8. In a rack frame in accordance with claim 7, wherein each of the fastening elements (60) comprises a first leg (63) and a second leg (64) which are spaced apart and are parallel to each other, the first leg (63) and the second leg (64) extending beyond each side of each of the first fastening strips (21, 22) and the second fastening strip (11), the first leg (63) facing one of the wall elements (30, 40) and having a leg screw receiver (62), the second leg (64) facing away from one of the wall elements (30, 40) and having a threaded receiver (61) aligned with the leg screw receiver (62), each of the wall elements (30, 40) having a wall screw receiver (32) aligned with the leg screw receiver (62), and a fastening screw (70) insertable within the leg screw receiver (62) and the wall screw receiver (32) and engaging the threaded receiver (61).

9. In a rack frame in accordance with claim 8, wherein the first leg (63) and the second leg (64) extend parallel with one of the wall elements (30, 40), and the first leg (63) and the second leg (64) are oriented toward a front on the front supports (10) and toward a rear on the rear supports (20).

10. In a rack frame in accordance with claim 9, wherein the longitudinal receiver (15) on a facing inner side of the front supports (10) has a shoulder which makes a transition toward the front into a stop (16).

11. In a rack frame in accordance with claim 10, wherein each of the front supports (10) has a longitudinally directed holding strip (18) on which the U-shaped fastening elements (60) can be positioned in a longitudinal direction, and a holder leg (53) of the holder (50) forms an elongated hole (52) extending in a direction of the depth of the rack frame, and a fastening screw (55) is engageable with a threaded receiver (61) of one of the fastening elements (60).

12. In a rack frame in accordance with claim 11, wherein the holding strip (18) is recessed from an interior of the rack frame, and is parallel with respect to an exterior of the front support (10) and is adjacent the shoulder of the front support (10).

13. In a rack frame in accordance with claim 12, wherein each of the fastening elements (60) comprises a first leg (63) and a second leg (64) that extend beyond the holding strip (18) on both sides of the holding strip (18), the first leg (63) faces away from an angle element and has a threaded receiver (61), and the second leg (64) faces the angle element and has the screw receiver (62) aligned with the threaded receiver (61).

14. In a rack frame in accordance with claim 13, wherein the first leg (63) and the second leg (64) of each of the fastening elements (60) are oriented toward the front of the rack frame.

15. In a rack frame in accordance with claim 14, wherein the leg (53) of the angle element is positioned on a downward extending brace (90), and the downward extending brace (90) is positioned on one of the front supports (10) by a retaining projection (91).

16. In a rack frame in accordance with claim 15, wherein the retaining projection (91) of the downward extending brace (90) is attachable to the holding strip (18) of the front support (10) by the fastening elements (60).

17. In a rack frame in accordance with claim 2, wherein the vertical bearing strip (12) is adjacent to one of the at least two perpendicular longitudinal slots (23, 24) and the at least one longitudinal slot (13).

18. In a rack frame in accordance with claim 1, wherein a sealing element is positioned in one of the at least two perpendicular longitudinal slots (23, 24) and the at least one longitudinal slot (13).

19. In a rack frame in accordance with claim 2, wherein a sealing element is positioned on one of the vertical bearing strips (12) and the inside of one of the wall elements (30, 40) facing the vertical bearing strip (12).

20. In a rack frame in accordance with claim 1, wherein the second fastening strip (11) formed on one of the front supports (10) faces one of the plurality of first fastening strips (21, 22) formed on one of the rear supports (20).

21. In a rack frame in accordance with claim 1, wherein each of the fastening elements (60) comprises a first leg (63) and a second leg (64) which are spaced apart and are parallel to each other, the first leg (63) and the second leg (64) extending beyond each side of each of the first fastening strips (21, 22) and the second fastening strip (11), the first leg (63) facing one of the wall elements (30, 40) and having a leg screw receiver (62), the second leg (64) facing away from one of the wall elements (30, 40) and having a threaded receiver (61) aligned with the leg screw receiver (62), each of the wall elements (30, 40) having a wall screw receiver (32) aligned with the leg screw receiver (62), and a fastening screw (70) insertable within the leg screw receiver (62) and the wall screw receiver (32) and engaging the threaded receiver (61).

22. In a rack frame in accordance with claim 1, wherein the longitudinal receiver (15) on a facing inner side of the front supports (10) has a shoulder which makes a transition toward the front into a stop (16).

23. In a rack frame in accordance with claim 1, wherein each of the front supports (10) has a longitudinally directed holding strip (18) on which the U-shaped fastening elements (60) can be positioned in a longitudinal direction, and a holder leg (53) of the holder (50) forms an elongated hole (52) extending in a direction of the depth of the rack frame, and a fastening screw (55) is engageable with a threaded receiver (61) of one of the fastening elements (60).

* * * * *